(12) United States Patent
Lai et al.

(10) Patent No.: US 10,431,578 B2
(45) Date of Patent: Oct. 1, 2019

(54) ELECTROSTATIC DISCHARGE (ESD) PROTECTION DEVICE AND METHOD FOR OPERATING AN ESD PROTECTION DEVICE

(71) Applicant: NXP B.V., Eindhoven (NL)

(72) Inventors: Da-Wei Lai, Nijmegen (NL); Wei-Jhih Tseng, Nijmegen (NL)

(73) Assignee: NXP B.V., Eindhoven (NL)

( * ) Notice: Subject to any disclaimer, the term of this patent is extended or adjusted under 35 U.S.C. 154(b) by 294 days.

(21) Appl. No.: 15/471,259

(22) Filed: Mar. 28, 2017

(65) Prior Publication Data

US 2018/0286855 A1    Oct. 4, 2018

(51) Int. Cl.
| | |
|---|---|
| *H01L 27/02* | (2006.01) |
| *H02H 9/04* | (2006.01) |
| *H01L 29/08* | (2006.01) |
| *H01L 29/10* | (2006.01) |
| *H01L 29/78* | (2006.01) |

(52) U.S. Cl.
CPC ........ *H01L 27/0277* (2013.01); *H01L 27/027* (2013.01); *H01L 27/0259* (2013.01); *H01L 27/0262* (2013.01); *H01L 27/0266* (2013.01); *H01L 27/0292* (2013.01); *H02H 9/046* (2013.01); *H01L 29/0804* (2013.01); *H01L 29/0821* (2013.01); *H01L 29/0847* (2013.01);
(Continued)

(58) Field of Classification Search
CPC ............. H01L 27/0292; H01L 27/0266; H01L 27/0262; H01L 27/0259; H01L 27/027; H01L 27/0277; H01L 29/1095; H01L 29/1004; H01L 29/0847; H01L 29/0821; H01L 29/783; H01L 29/0804; H02H 9/046

USPC .......................................................... 361/56
See application file for complete search history.

(56) References Cited

U.S. PATENT DOCUMENTS

| | | |
|---|---|---|
| 9,153,571 B1 | 10/2015 | Chen et al. |
| 2001/0015881 A1 | 8/2001 | Takikawa et al. |

(Continued)

FOREIGN PATENT DOCUMENTS

| | | |
|---|---|---|
| EP | 3001457 A1 | 3/2016 |
| EP | 3107122 A1 | 12/2016 |

OTHER PUBLICATIONS

Lai, Da-Wei et al; PNP-eSCR ESD Protection Device with Tunable Trigger and Holding Voltage for High Voltage Applications; IEEE Electrical Overstress/Electro Discharge Symposium, Sep. 11-16, 2016; IEEE Explore; 8 pages (Oct. 8, 2016).

(Continued)

*Primary Examiner* — Kevin J Comber

(57) ABSTRACT

Embodiments of an electrostatic discharge (ESD) protection device and a method for operating an ESD protection device are described. In one embodiment, an ESD protection device includes stacked first and second PNP bipolar transistors that are configured to shunt current between a first node and a second node in response to an ESD pulse received between the first and second nodes and an NMOS transistor connected in series with the stacked first and second PNP bipolar transistors and the second node. An emitter and a base of the second PNP bipolar transistor are connected to a collector of the first PNP bipolar transistor. A gate terminal of the NMOS transistor is connected to a source terminal of the NMOS transistor. Other embodiments are also described.

20 Claims, 9 Drawing Sheets

(52) U.S. Cl.
CPC ...... *H01L 29/1004* (2013.01); *H01L 29/1095* (2013.01); *H01L 29/783* (2013.01)

(56) References Cited

U.S. PATENT DOCUMENTS

| | | | |
|---|---|---|---|
| 2002/0130390 A1* | 9/2002 | Ker | H01L 27/0255 257/546 |
| 2011/0096446 A1 | 4/2011 | Croft | |
| 2011/0176243 A1 | 7/2011 | Zhan et al. | |
| 2012/0091503 A1* | 4/2012 | Su | H01L 27/0262 257/140 |
| 2017/0084602 A1 | 3/2017 | Wang et al. | |

OTHER PUBLICATIONS (U.S. Appl. No. 15/006,812), filed Jan. 26, 2016.

* cited by examiner

ELECTROSTATIC DISCHARGE (ESD) PROTECTION DEVICE AND METHOD FOR OPERATING AN ESD PROTECTION DEVICE

Embodiments of the invention relate generally to electronic hardware and methods for operating electronic hardware, and, more particularly, to electrostatic discharge (ESD) protection devices and methods for operating an ESD protection device.

Electrostatic discharge is a sudden flow of electricity that can be caused by a buildup of static electricity. An ESD protection device can be used to shunt ESD current to prevent thermal damage in a device. For example, an ESD protection device can be integrated onto an electrical device, such as an integrated circuit (IC) chip, to provide a low impedance channel to prevent thermal damage to components of the electrical device. The operating characteristics of an ESD protection device (e.g., the trigger voltage at which the ESD protection device is activated to shunt ESD current, the ESD reaction time for activating the ESD protection device to shunt ESD current, and/or the temperature sensitivity of the snapback holding voltage at which a breakdown condition occurs in the ESD protection device) can affect the performance of the ESD protection device.

SUMMARY

Embodiments of an ESD protection device and a method for operating an ESD protection device are described. In one embodiment, an ESD protection device includes stacked first and second PNP bipolar transistors that are configured to shunt current between a first node and a second node in response to an ESD pulse received between the first and second nodes and an NMOS transistor connected in series with the stacked first and second PNP bipolar transistors and the second node. An emitter and a base of the second PNP bipolar transistor are connected to a collector of the first PNP bipolar transistor. A gate terminal of the NMOS transistor is connected to a source terminal of the NMOS transistor. Other embodiments are also described.

In an embodiment, an emitter of each PNP bipolar transistor of the stacked first and second PNP bipolar transistors is connected to a base of the PNP bipolar transistor. The emitter and the base of the first PNP bipolar transistor is connected to the first node.

In an embodiment, a drain terminal of the NMOS transistor is connected to a collector of the second PNP bipolar transistor.

In an embodiment, the gate terminal and the source terminal of the NMOS transistor are connected to the second node.

In an embodiment, a body of the NMOS transistor is connected to the second node.

In an embodiment, the second node is connected to ground, and the first node is connected to a positive voltage.

In an embodiment, each of the stacked first and second PNP bipolar transistors includes collector components, emitter components, and a base structure that surrounds the collector components and the emitter components. The emitter components are alternately located with respect to the collector components.

In an embodiment, the base structure includes an N-doped region.

In an embodiment, the collector components and the emitter components are located on top of an N-well region. The N-well region is located on top of a deep N-well region.

In an embodiment, each of the stacked first and second PNP bipolar transistors further includes a P-well region that is separate from the N-well region by a substrate region.

In an embodiment, the NMOS transistor is formed on top of at least one P-well region. The at least one P-well region is located on top of a substrate region.

In an embodiment, the gate terminal, the source terminal, and a drain terminal of the NMOS transistor are located on top of the at least one P-well region.

In an embodiment, an ESD protection device includes stacked first and second PNP bipolar transistors that are configured to shunt current between a first node and a second node in response to an ESD pulse received between the first and second nodes and a grounded-gate NMOS transistor connected in series with the second PNP bipolar transistor and the second node. An emitter and a base of the first PNP bipolar transistor are connected to the first node. An emitter and a base of the second PNP bipolar transistor is connected to a collector of the first PNP bipolar transistor. A gate terminal, a source terminal, and a body of the grounded-gate NMOS transistor are connected to the second node. The second node is connected to ground.

In an embodiment, a drain terminal of the grounded-gate NMOS transistor is connected to a collector of the second PNP bipolar transistor.

In an embodiment, each of the stacked first and second PNP bipolar transistors includes collector components, emitter components, and a base structure that surrounds the collector components and the emitter components. The emitter components are alternately located with respect to the collector components.

In an embodiment, the base structure includes an N-doped region. The collector components and the emitter components are located on top of an N-well region. The N-well region is located on top of a deep N-well region.

In an embodiment, each of the stacked first and second PNP bipolar transistors further includes a P-well region that is separated from the N-well region by a substrate region.

In an embodiment, the grounded-gate NMOS transistor is formed on top of a P-well region. The P-well region is located on top of a substrate region. The gate terminal, the source terminal, and a drain terminal of the grounded-gate NMOS transistor are located on top of the P-well region.

In an embodiment, the grounded-gate NMOS transistor is formed on top of a first P-well region and a second P-well region. The first and second P-well regions are located on top of a substrate region. The gate terminal, the source terminal, and a drain terminal of the grounded-gate NMOS transistor are located on top of the second P-well region. A doping concentration of the first P-well region is different from a doping concentration of the second P-well region.

In an embodiment, a method for operating an ESD protection device involves receiving an ESD pulse at the ESD protection device, in response to the ESD pulse, shunting an ESD current from the ESD pulse through stacked first and second PNP bipolar transistors of the ESD protection device, and in response to shunting the ESD current through the stacked first and second PNP bipolar transistors, triggering a parasitic NPN bipolar transistor in an NMOS transistor of the ESD protection device.

Other aspects in accordance with an embodiment of the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
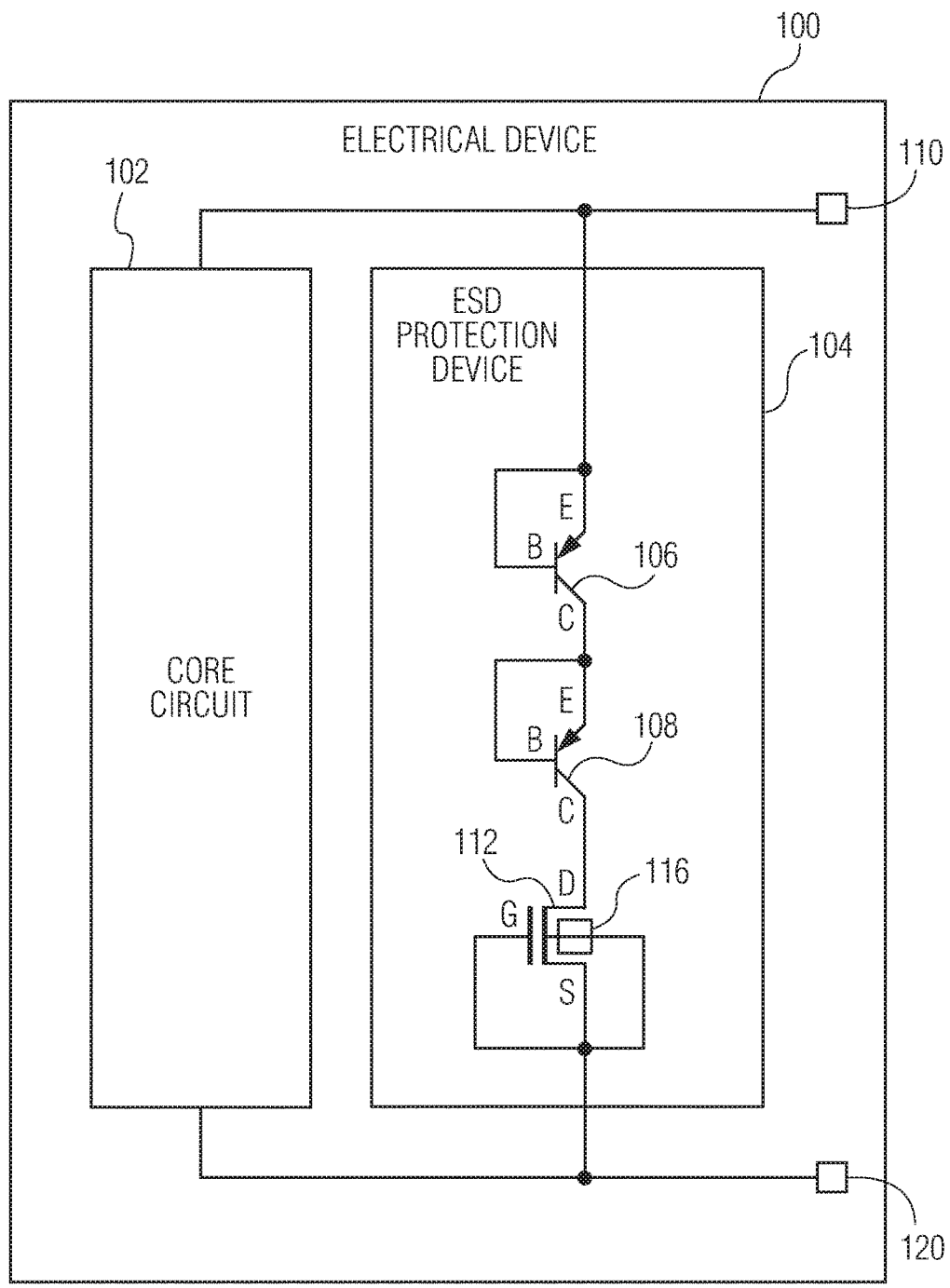
FIG. 1 is a schematic block diagram of an electrical device in accordance with an embodiment of the invention.

FIG. 1 is a schematic block diagram of an electrical device 100 in accordance with an embodiment of the invention. In the embodiment depicted in FIG. 1, the electrical device includes a core circuit 102 and an ESD protection device 104 that is used to protect the core circuit during an ESD event, which may be an ESD test or an actual ESD strike. The core circuit and the ESD protection device are both connected to first and second nodes 110, 120. The first and second nodes 110, 120 are coupled to different voltages. In some embodiments, the first node 110 is connected to a positive voltage and the second node 120 is connected to the ground or a voltage that is lower than the voltage at the first node 110. In an embodiment, the electrical device is an IC device and the first and second nodes are electrical terminals of the IC device, such as electrical contact pads or electrical contact pins of the IC device.

The electrical device 100 can be used in various applications, such as automotive applications, communications applications, industrial applications, medical applications, computer applications, and/or consumer or appliance applications. In some embodiments, the electrical device is an IC device. For example, the electrical device can be implemented in a substrate, such as a semiconductor wafer or a printed circuit board (PCB). In some embodiments, the electrical device is included in a computing device, such as a smartphone, a tablet computer, a laptop, etc. For example, the electrical device may be included in a Near Field Communications (NFC) capable computing device. Although the electrical device is shown in FIG. 1 as including the core circuit 102 and the ESD protection device 104, in other embodiments, the electrical device may include additional circuit elements. For example, the electrical device may include a control circuit that is located in a low voltage domain and used to control the core circuit that is located in a high voltage domain.

The core circuit 102 is a device to be protected by the ESD protection device 104 in case of an ESD event, such as an ESD pulse received between the first and second nodes 110, 120. The core circuit typically includes one or more internal circuit components, such as transistors, capacitors, or diodes, which are susceptible to ESD strikes. Examples of the core circuit include, but are not limited to, microcontrollers, transceivers, and switching circuits, which can be used for, for example, in vehicle control or communications, identification, wireless communications, and/or lighting control. In an embodiment, the core circuit is packaged as a semiconductor IC chip.

The ESD protection device 104 protects the core circuit 102 during an ESD event, such as an ESD pulse received between the first and second nodes 110, 120. The ESD protection device can be used to protect a power supply domain of the electrical device 100. For example, the ESD protection device may be connected to a power supply rail of the electrical device and may shunt ESD current to protect the core circuit in response to an ESD pulse. The ESD protection device can be implemented by suitable semiconductor devices. In the embodiment depicted in FIG. 1, the ESD protection device includes first and second PNP bipolar transistors 106, 108 configured to shunt current in response to an ESD pulse received between the first node and the second node and an N-channel metal-oxide-semiconductor (NMOS) device 112 connected to the stacked first and second PNP bipolar transistors and to the second node. In the embodiment depicted in FIG. 1, the first and second PNP bipolar transistors 106, 108 are stacked in the ESD protection device such that the emitter (E) and the base (B) of the second PNP bipolar transistor are connected to the collector (C) of the first PNP bipolar transistor. The gate terminal (G) of the NMOS transistor is connected to the source terminal (S) of the NMOS transistor. Although the ESD protection device is shown in FIG. 1 as including the first and second PNP bipolar transistors and the NMOS device, in other embodiments, the electrical device may include additional circuit elements. For example, the ESD protection device may include one or more additional transistors and/or resistors. An ESD protection device with bipolar transistors that form an embedded silicon controlled rectifier (eSCR) component typically has a high trigger voltage. Compared to a ESD protection device with bipolar transistors forming an eSCR component that generally cannot protect a high voltage core circuit due to high trigger voltage, the ESD protection device 104 depicted in FIG. 1 can be used to protect a high voltage core circuit (e.g., a 30V electrical circuit, such as a 30V extended drain NMOS (EDNMOS) transistor). In addition, an ESD protection device with bipolar transistors that form an eSCR component typically has a slow ESD reaction. Compared to an ESD protection device with bipolar transistors that form an eSCR component, the ESD protection device 104 depicted in FIG. 1 can react quickly (e.g., have an ESD reaction time of under 1 nanosecond (ns)) for activating the ESD protection device to shunt ESD current. Further, an ESD protection device with bipolar transistors that form an eSCR component typically has a temperature dependent snapback holding voltage. Compared to an ESD protection device with bipolar transistors forming an eSCR component that has a temperature dependent snapback holding voltage, the ESD protection device 104 depicted in FIG. 1 can have a lower snapback holding voltage at which a breakdown condition occurs in the ESD protection device under high temperature.

In the embodiment depicted in FIG. 1, the emitter (E) of the first PNP bipolar transistor 106 is connected to the base (B) of the first PNP bipolar transistor while the emitter (E) of the second PNP bipolar transistor 108 is connected to the base (B) of the second PNP bipolar transistor. In some embodiments, the emitter (E) and the base (B) of the first PNP bipolar transistor 106 are connected to the first node 110, which is connected to a positive and potentially high voltage. An ESD pulse may be applied to the first node during an ESD event. The collector (C) of the second PNP bipolar transistor is connected to the drain terminal (D) of the NMOS transistor 112. The gate terminal (G) and the source terminal (S) of the NMOS transistor are connected to the second node 120, which may be connected to a reference voltage (e.g., ground). In some embodiments, the NMOS transistor is a grounded-gate NMOS (ggNMOS) transistor whose gate terminal (D) is connected to the ground. The NMOS transistor also includes a body 116 that is electrically connected to the gate terminal (G), to the source terminal (S) of the NMOS transistor, and to the second node 120, through conductive materials (e.g., one or more wires or metal contacts). Although the first PNP bipolar transistor, the second PNP bipolar transistor, and the NMOS transistor are shown in FIG. 1 as being connected in a certain manner, in other embodiments, the first PNP bipolar transistor, the second PNP bipolar transistor, and the NMOS transistor are connected differently from the embodiment depicted in FIG. 1.

In an example operation of the ESD protection device 104, during an ESD event (e.g., an ESD pulse received between the first node 110 and the second node 120), if the ESD voltage exceeds the trigger voltage of the ESD protection device, the first and second PNP bipolar transistors 106 and 108 are turned on. Once the first and second PNP bipolar transistors are turned on, ESD current is injected into the drain terminal (D) of the NMOS transistor 112. A parasitic NPN bipolar transistor is formed with the drain terminal (D) of the NMOS transistor acting as the collector of the parasitic NPN bipolar transistor, the body and the source terminal (S) of the NMOS transistor acting as the emitter of the parasitic NPN bipolar transistor, and the substrate of the NMOS transistor acting as the base of the parasitic NPN bipolar transistor. Parasitic resistance is present between the emitter and base terminals of the parasitic NPN bipolar transistor. When an ESD current is injected into the drain terminal (D) of the NMOS transistor 112, the collector-base junction of the parasitic NPN bipolar transistor becomes reverse biased to the point of avalanche breakdown, causing current flowing from the base of the parasitic NPN bipolar transistor to ground. The current flow induces a voltage potential across the parasitic resistance, causing a positive voltage to appear across the base-emitter junction of the parasitic NPN bipolar transistor, triggering the parasitic NPN bipolar transistor in the NMOS transistor 112 to conduct ESD current. Using the combination of the stacked first and second PNP bipolar transistors and the NMOS transistor, the ESD protection device 104 depicted in FIG. 1 can have lower trigger voltage than an ESD protection device with bipolar transistors that form an eSCR component. Consequently, the ESD protection device depicted in FIG. 1 can be used to protect a high voltage core circuit (e.g., a 30V electrical circuit, such as a 30V extended drain NMOS (EDNMOS) transistor). In addition, using the combination of the stacked first and second PNP bipolar transistors and the NMOS transistor, the ESD protection device 104 depicted in FIG. 1 can have faster ESD reaction than an ESD protection device with bipolar transistors that form an eSCR component. Consequently, the ESD protection device depicted in FIG. 1 can be used in applications with fast ESD transient. Further, using the combination of the stacked first and second PNP bipolar transistors and the NMOS transistor, the ESD protection device 104 depicted in FIG. 1 can have a lower snapback holding voltage under high temperature, compared to an ESD protection device with bipolar transistors that form an eSCR component. Consequently, the ESD protection device depicted in FIG. 1 can provide stable ESD protection under a wide temperature range.

Figure 2:
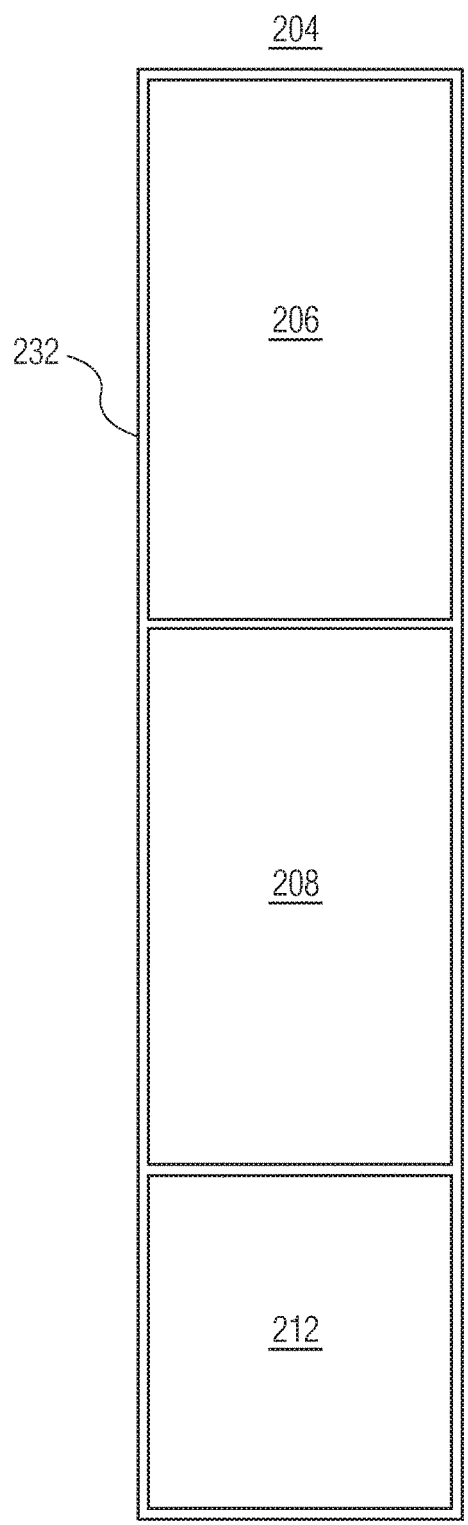
FIG. 2 depicts a top layout view of an ESD protection device in accordance with an embodiment of the invention.

FIG. 2 depicts a top layout view of an ESD protection device 204 in accordance with an embodiment of the invention. In the top layout view depicted in FIG. 2, the ESD protection device 204 includes first and second PNP bipolar transistors 206, 208 and an NMOS transistor 212 formed within a P-doped structure 232. The ESD protection device depicted in FIG. 2 is a possible implementation of the ESD protection device 104 depicted in FIG. 1. However, the ESD protection device depicted in FIG. 1 can be implemented differently from the layout depicted in FIG. 2.

Figure 3:
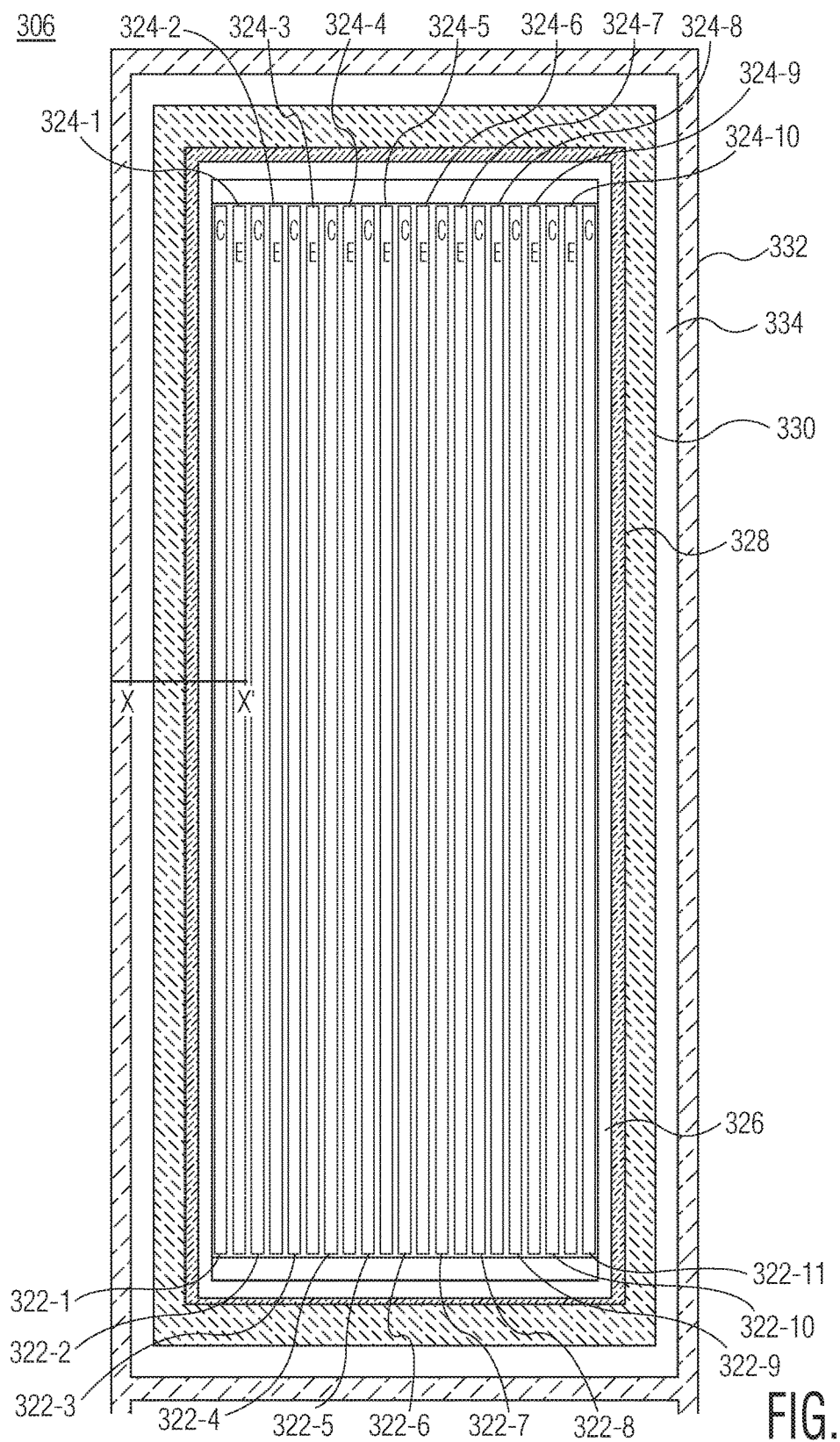
FIG. 3 depicts a top layout view of a PNP bipolar transistor in accordance with an embodiment of the invention.

FIG. 3 depicts a top layout view of a PNP bipolar transistor 306 in accordance with an embodiment of the invention. In the top layout view depicted in FIG. 3, the PNP bipolar transistor includes a collector having collector components 322-1, 322-2, 322-3, 322-4, 322-5, 322-6, 322-7, 322-8, 322-9, 322-10, 322-11, an emitter having emitter components 324-1, 324-2, 324-3, 324-4, 324-5, 324-6, 324-7, 324-8, 324-9, 324-10 that are alternately located with respect to the collector components, and a base structure 326. In some embodiments, the collector components and the emitter components are P-doped while the base structure is N-doped. The doping concentration of the base structure can affect the trigger voltage of the PNP bipolar transistor. For example, if the base structure has a high doping concentration (e.g., heavily N-doped), the PNP bipolar transistor has a low trigger voltage. If the base structure has a low doping concentration (e.g., lightly N-doped), the PNP bipolar transistor has a high trigger voltage. In some embodiments, the high doping concentration of the base structure is one order of magnitude higher than the low doping concentration of the base structure. For example, the high doping concentration of the base structure is around $1\times10^{17}$ (1E17) atoms/cm$^3$ (e.g., ±5%) while the low doping concentration of the base structure is around $1\times10^{16}$ (1E16) atoms/cm$^3$ (e.g., ±5%). The base structure may include at least one substrate region or at least one active region that surrounds the collector components and the emitter components. In some embodiments, an active region is a doped region, for example, an n-type doped region or a p-type doped region. The active region may be formed on top of (e.g., in direct contact with) a substrate region. In some embodiments, the doping concentration of the active region may be different from (e.g., higher than) the doping concentration of an underlying substrate region. In the top layout view depicted in FIG. 3, the collector, the emitter, and the base structure of the PNP bipolar transistor are formed on a deep N-well region 328. In some embodiments, the deep N-well region includes a doped layer that is located underneath an N-well. In an embodiment, the depth of the deep N-well region into the substrate is more than the depth of a normal well structure (e.g., an N-well). The depth of the deep N-well region into the substrate may be around twice or three times the depth of a normal well structure. For example, the depth of the deep N-well region may be around 1,600 µm (e.g., ±5%) while the depth of a normal N-well may be around 600 µm (e.g., ±5%). The deep N-well region can be biased to create a dedicated integrated diode and to enhance latch-up immunity of nearby circuitry. Because the PNP bipolar transistor 306 is formed on the deep N-well region, the trigger voltage of the ESD protection device 204 can be boosted quickly and the ESD reaction time for activating the ESD protection device to shunt ESD current can be reduced. In the top layout view depicted in FIG. 3, an N-well region 330 is formed at least partially on top of (e.g., in direct contact with) the deep N-well region 328. A P-well region 332 surrounds the N-well region 330. A trench 334 is located between the N-well region 330 and the P-well region 332.

The PNP bipolar transistor 306 depicted in FIG. 3 is a possible implementation of the PNP bipolar transistor 206 depicted in FIG. 2. However, the PNP bipolar transistor 206 depicted in FIG. 2 can be implemented differently from the layout depicted in FIG. 3. For example, although the PNP bipolar transistor 306 is shown in FIG. 3 as including a certain number of N-doped sections and P-doped sections, in other embodiments, the PNP bipolar transistor 206 may include more N-doped sections and/or more P-doped sections and/or less N-doped sections and/or less P-doped sections. In another example, although the PNP bipolar transistor 306 is shown in FIG. 3 as including eleven collector components and ten emitter components, in other embodiments, the PNP bipolar transistor 206 may include more than or less than eleven collector components and/or more than or less than ten emitter components.

Figure 4:
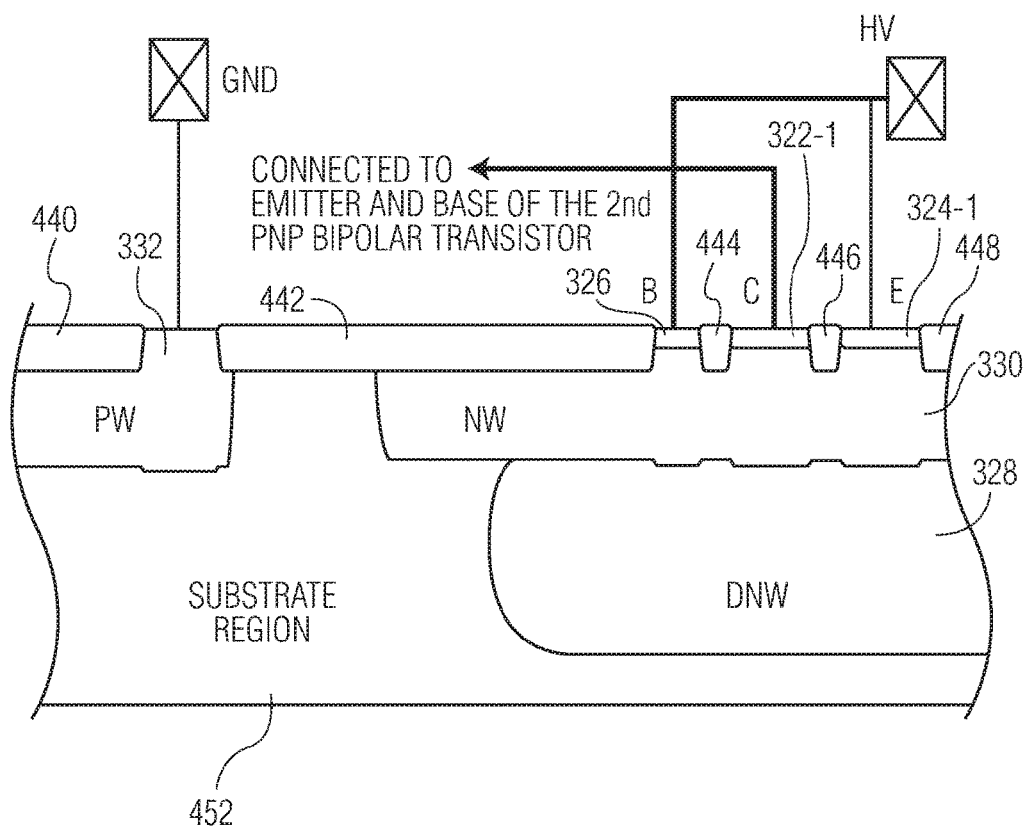
FIG. 4 depicts a cross sectional view of the PNP bipolar transistor depicted in FIG. 3 in accordance with an embodiment of the invention.

FIG. 4 depicts a cross sectional view of the PNP bipolar transistor 306 depicted in FIG. 3 at the location indicated by the line from X to X' in accordance with an embodiment of the invention. In the X-X' cross-sectional view, the P-well region (PW) 332, the N-well region (NW) 330, and the deep N-well region (DNW) 328 are formed on top of (e.g., in direct contact with) a p-doped substrate region 452, which can be an epitaxial film, an epitaxial layer, or any other suitable substrate structure. The P-well region may be electrically connected to a ground (GND) pin, which is an embodiment of the second node 120 depicted in FIG. 1. The base structure (B) 326 (e.g., an N-doped region), the collector component 322-1, and the emitter component 324-1 (e.g., P-doped regions) are located on top of the N-well region. The base structure (B) 326 and the emitter component 324-1 are connected to a high voltage (HV) pin, which is an embodiment of the first node 110 depicted in FIG. 1. The collector component 322-1 is connected to the emitter (E) and to the base (B) of the second PNP bipolar transistor 208 depicted in FIG. 2, for example, through conductive material (e.g., one or more metal contacts). A low resistance layer (e.g., a silicided layer) may be formed on the surface of the PNP bipolar transistor for better connection with other circuits (e.g., the second PNP bipolar transistor 208) or terminals (e.g., the GND pin and/or the HV pin). In the embodiment depicted in FIG. 4, the PNP bipolar transistor does not have a floating base. Consequently, the possibility of potential latch-up problem when the PNP bipolar transistor interacts with adjacent circuits can be reduced. Isolator regions 440, 442, 444, 446, and 448 (e.g., shallow trench isolation regions filled with oxide or other isolation material) are formed on top of (e.g., in direct contact with) the P-well region, the substrate region, and the N-well region, respectively.

Figure 5:
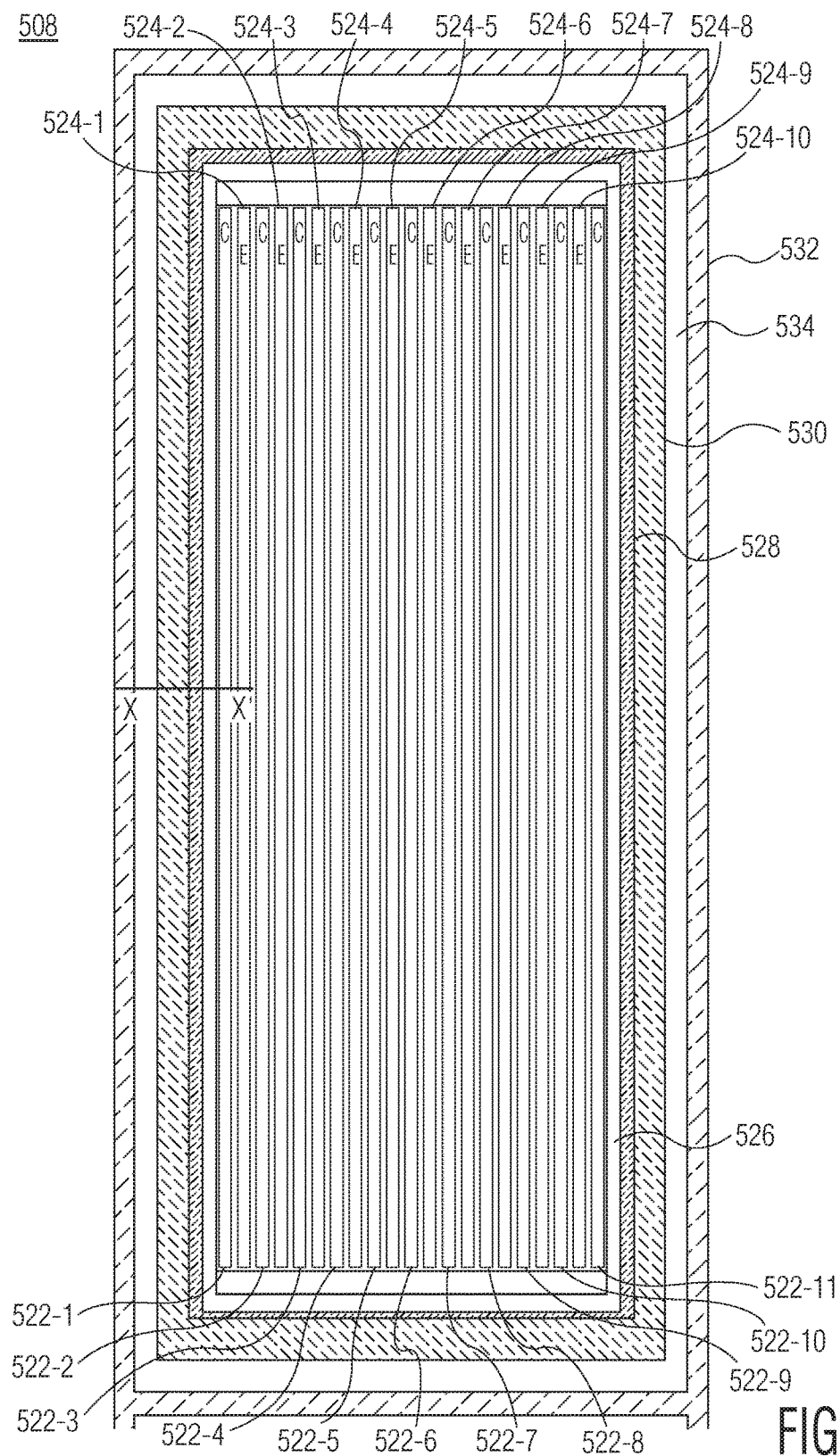
FIG. 5 depicts a top layout view of a PNP bipolar transistor in accordance with an embodiment of the invention.

FIG. 5 depicts a top layout view of a PNP bipolar transistor 508 in accordance with an embodiment of the invention. In the top layout view depicted in FIG. 5, the PNP bipolar transistor includes a collector having collector components 522-1, 522-2, 522-3, 522-4, 522-5, 522-6, 522-7, 522-8, 522-9, 522-10, 522-11, an emitter having emitter components 524-1, 524-2, 524-3, 524-4, 524-5, 524-6, 524-7, 524-8, 524-9, 524-10 that are alternately located with respect to the collector components, and a base structure 526. In some embodiments, the collector components and the emitter components are P-doped while the base structure is N-doped. The doping concentration of the base structure can affect the trigger voltage of the PNP bipolar transistor. For example, if the base structure has a high doping concentration (e.g., heavily N-doped), the PNP bipolar transistor has a low trigger voltage. If the base structure has a low doping concentration (e.g., lightly N-doped), the PNP bipolar transistor has a high trigger voltage. The base structure may include at least one substrate region or at least one active region that surrounds the collector components and the emitter components. The collector, the emitter, and the base structure of the PNP bipolar transistor are formed on a deep N-well region 528. An N-well region 530 is formed at least partially on top of (e.g., in direct contact with) the deep N-well region 328. A P-well region 532 surrounds the N-well region 530. A trench 534 is located between the N-well region 330 and the P-well region 332. The PNP bipolar transistor 508 depicted in FIG. 5 is a possible implementation of the second PNP bipolar transistor 208 depicted in FIG. 2. However, the second PNP bipolar transistor 208 depicted in FIG. 2 can be implemented differently from the layout depicted in FIG. 5.

Figure 6:
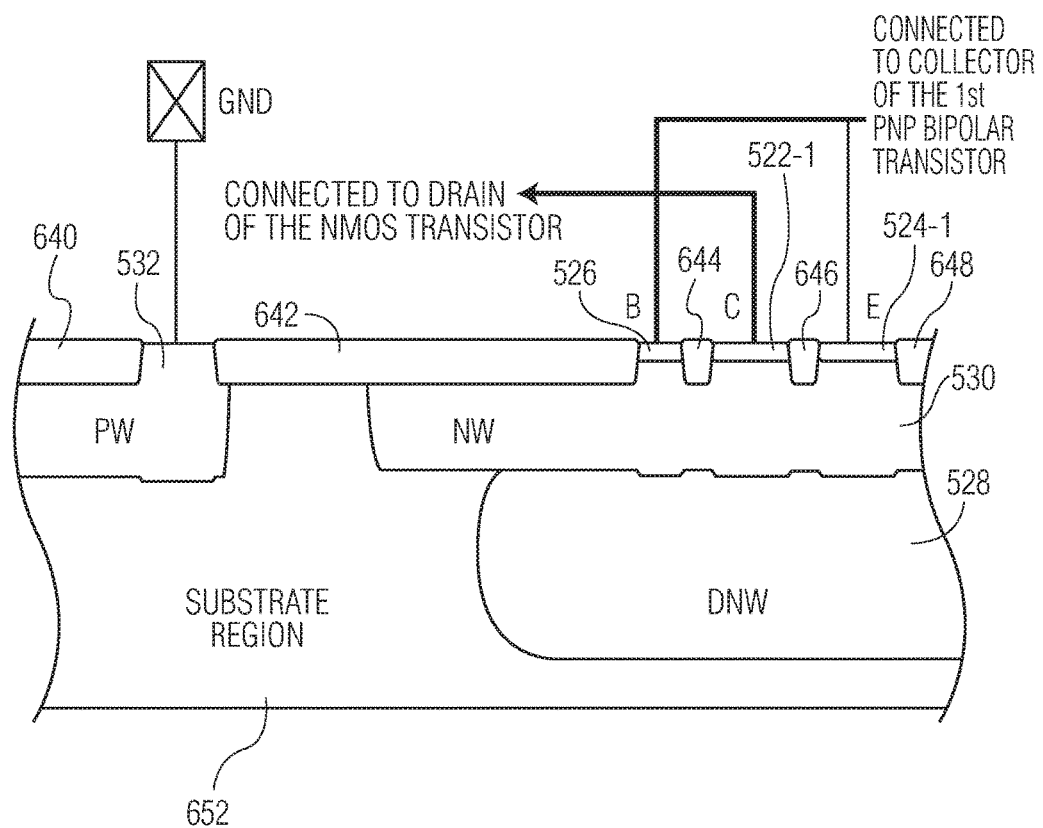
FIG. 6 depicts a cross sectional view of the PNP bipolar transistor depicted in FIG. 5 in accordance with an embodiment of the invention.

FIG. 6 depicts a cross sectional view of the PNP bipolar transistor 508 depicted in FIG. 5 at the location indicated by the line from X to X' in accordance with an embodiment of the invention. In the X-X' cross-sectional view, the P-well region (PW) 532, the N-well region (NW) 530, and the deep N-well region (DNW) 528 are formed on top of a p-doped substrate region 552, which can be an epitaxial film, an epitaxial layer, or any other suitable substrate structure. The P-well region is electrically connected to a ground (GND) pin, which is an embodiment of the second node 120 depicted in FIG. 1. The base structure (B) 526 (e.g., an N-doped region), the collector component 522-1, and the emitter component 524-1 (e.g., P-doped regions) are located on top of (e.g., in direct contact with) the N-well region. The base structure (B) 526 and the emitter component 324-1 are connected to the collector of the PNP bipolar transistor 206. The collector component 322-1 is connected to the drain terminal of the NMOS transistor 212 depicted in FIG. 2, for example, through conductive material (e.g., one or more metal contacts). A low resistance layer (e.g., a silicided layer) may be formed on the surface of the PNP bipolar transistor for better connection with other circuits (e.g., the PNP bipolar transistor 206 and/or the NMOS transistor 212) or one or more terminals (e.g., the GND pin). In the embodiment depicted in FIG. 6, the PNP bipolar transistor does not have a floating base. Consequently, the possibility of potential latch-up problem when the PNP bipolar transistor interacts with adjacent circuits can be reduced. Isolator regions 640, 642, 644, 646, and 648 (e.g., shallow trench isolation regions filled with oxide or other isolation material) are formed on top of the P-well region, the substrate region, and the N-well region, respectively.

Figure 7:
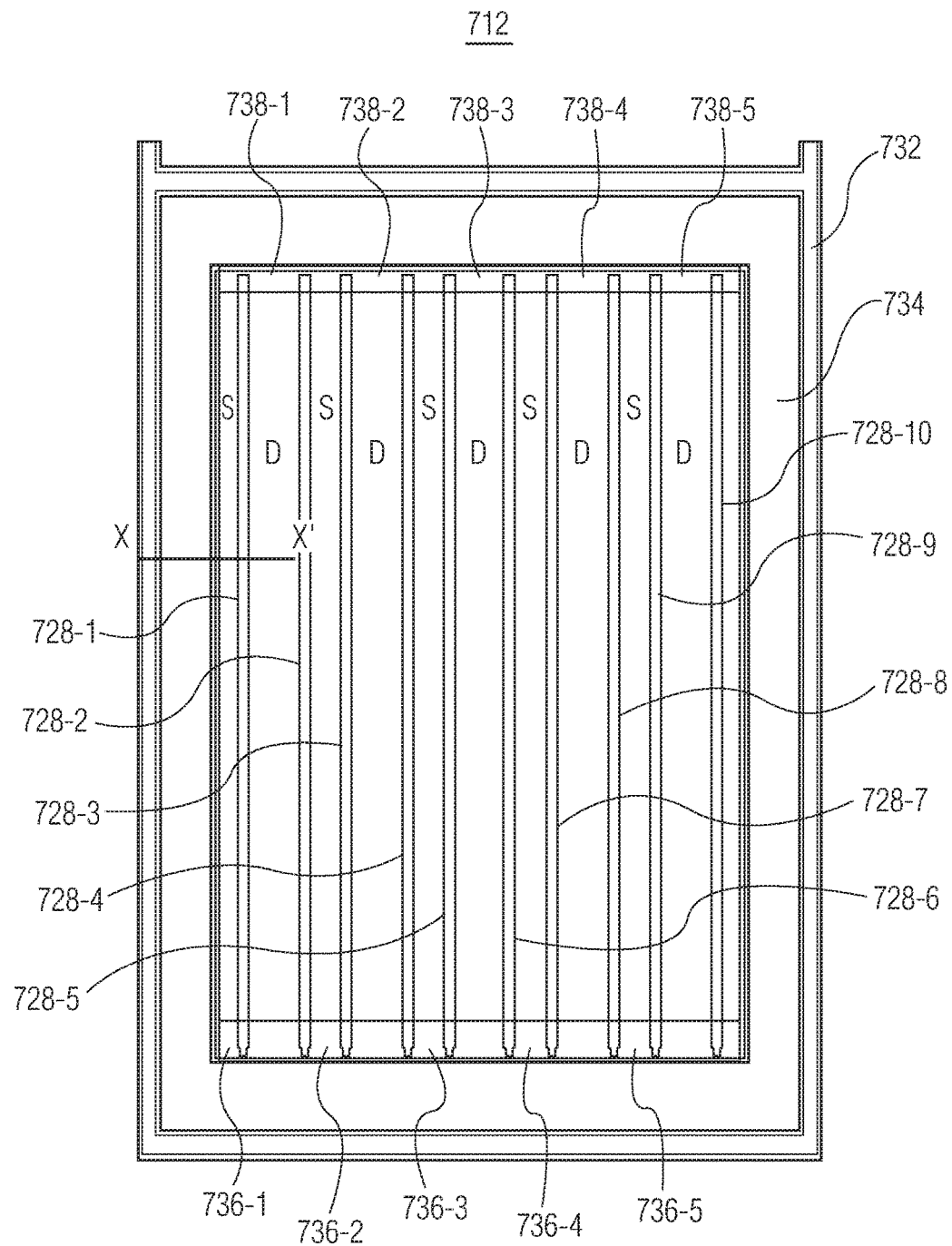
FIG. 7 depicts a top layout view of an NMOS transistor in accordance with an embodiment of the invention.

FIG. 7 depicts a top layout view of an NMOS transistor 712 in accordance with an embodiment of the invention. In the top layout view depicted in FIG. 3, the NMOS transistor includes source components 736-1, 736-2, 736-3, 736-4, 736-5, drain components 738-1, 738-2, 738-3, 738-4, 738-5 that are alternately located with respect to the source components, and gate polysilicon components 728-1, 728-2, 728-3, 728-4, 728-5, 728-6, 728-7, 728-8, 728-9, 728-10. A P-well region 332 surrounds the source components, the drain components, and the gate polysilicon components. A trench 734 is located between the source components, the drain components, and the gate polysilicon components and the P-well region 732. In some embodiments, the source components and the drain components are N-doped. The NMOS transistor 712 depicted in FIG. 7 is a possible implementation of the NMOS transistor 212 depicted in FIG. 2. However, the NMOS transistor 212 depicted in FIG. 2 can be implemented differently from the layout depicted in FIG. 7. For example, although the NMOS transistor 712 is shown in FIG. 7 as including a certain number of N-doped sections and P-doped sections, in other embodiments, the NMOS transistor 212 may include more N-doped sections and/or more P-doped sections and/or less N-doped sections and/or less P-doped sections. In another example, although the NMOS transistor 712 is shown in FIG. 7 as including five source components, five drain components, and ten gate polysilicon components, in other embodiments, the NMOS transistor 212 may include more than or less than five source components, more than or less than five drain components, and/or more than or less than ten gate polysilicon components.

Figure 8:
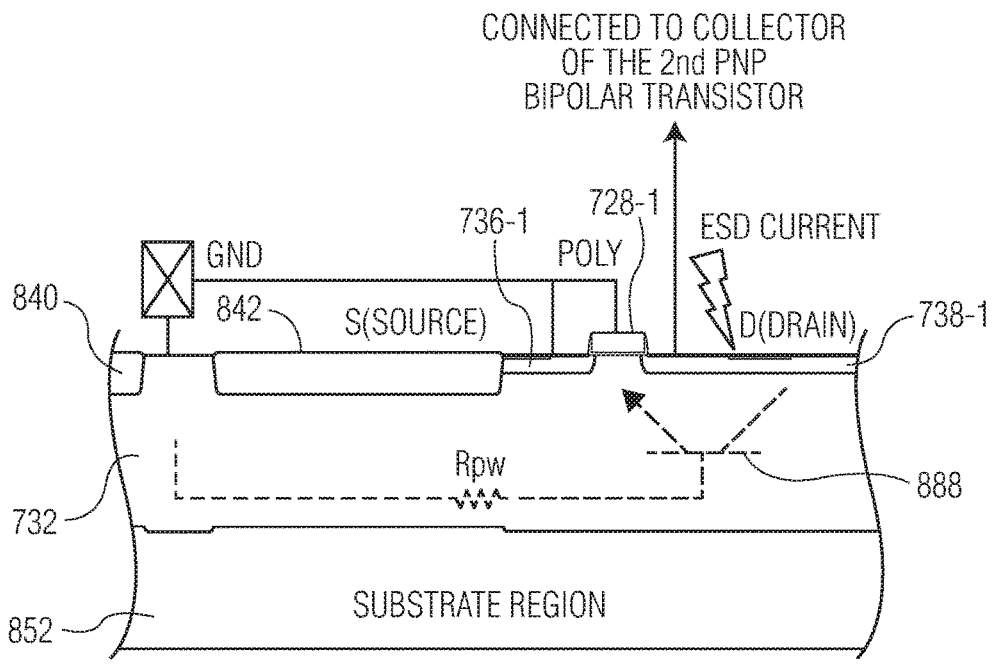
FIG. 8 depicts a cross sectional view of the NMOS transistor depicted in FIG. 7 in accordance with an embodiment of the invention.

FIG. 8 depicts a cross sectional view of the NMOS transistor 712 depicted in FIG. 7 at the location indicated by the line from X to X' in accordance with an embodiment of the invention. In the X-X' cross-sectional view, the NMOS transistor is a grounded-gate NMOS (ggNMOS) transistor whose gate terminal (D) is connected to the ground. As depicted in FIG. 8, the P-well region (PW) 732 is formed on top of (e.g., in direct contact with) a p-doped substrate region 852, which can be an epitaxial film, an epitaxial layer, or any other suitable substrate structure. The body of the NMOS transistor is formed within the P-well region. The P-well region, the source component 736-1, and the gate polysilicon component 728-1 are electrically connected to a ground (GND) pin, which is an embodiment of the second node 120 depicted in FIG. 1. The source component 736-1, the gate polysilicon component 728-1, and the drain component 738-1 of the NMOS transistor are located on top of the P-well region. The drain component 738-1 of the NMOS transistor is connected to the collector (C) of the second PNP bipolar transistor 208 depicted in FIG. 2, for example, through conductive material (e.g., one or more metal contacts). A low resistance layer (e.g., a silicided layer) may be formed on the surface of the NMOS transistor for better connection with other circuits (e.g., the second PNP bipolar transistor 208) or one or more terminals (e.g., the GND pin). In the embodiment depicted in FIG. 8, the NMOS transistor does not have a floating base. Consequently, the possibility of potential latch-up problem when the NMOS transistor interacts with adjacent circuits can be reduced. Isolator regions 840 and 842 (e.g., shallow trench isolation regions filled with oxide or other isolation material) are formed on top of (e.g., in direct contact with) the P-well region.

In an example operation of the NMOS transistor 712, during an ESD event, if the ESD voltage exceeds the trigger voltage of the ESD protection device, the first and second PNP bipolar transistors 206 and 208 are turned on and ESD current is injected into the drain terminal (D) of the NMOS transistor. A parasitic NPN bipolar transistor 888 is formed with the drain component 738-1 of the NMOS transistor acting as the collector of the parasitic NPN bipolar transistor, the source component 736-1 of the NMOS transistor acting as the emitter of the parasitic NPN bipolar transistor, and the P-well region 732 of the NMOS transistor acting as the base of the parasitic NPN bipolar transistor. Parasitic resistance, "Rpw," is present between the emitter and base terminals of the parasitic NPN bipolar transistor. When the ESD current is injected into the drain terminal (D) of the NMOS transistor 712, the reverse-junction between the drain component and the P-well region 732 becomes biased to the point of avalanche breakdown, causing hole current to flow into the P-well region 732 and lifting up the potential of the P-well region 732. The current flow induces a voltage potential across the parasitic resistance, Rpw, causing the junction between the P-well region 732 and the source component to be forward biased, triggering the parasitic NPN bipolar transistor of the NMOS transistor to conduct ESD current.

Figure 9:
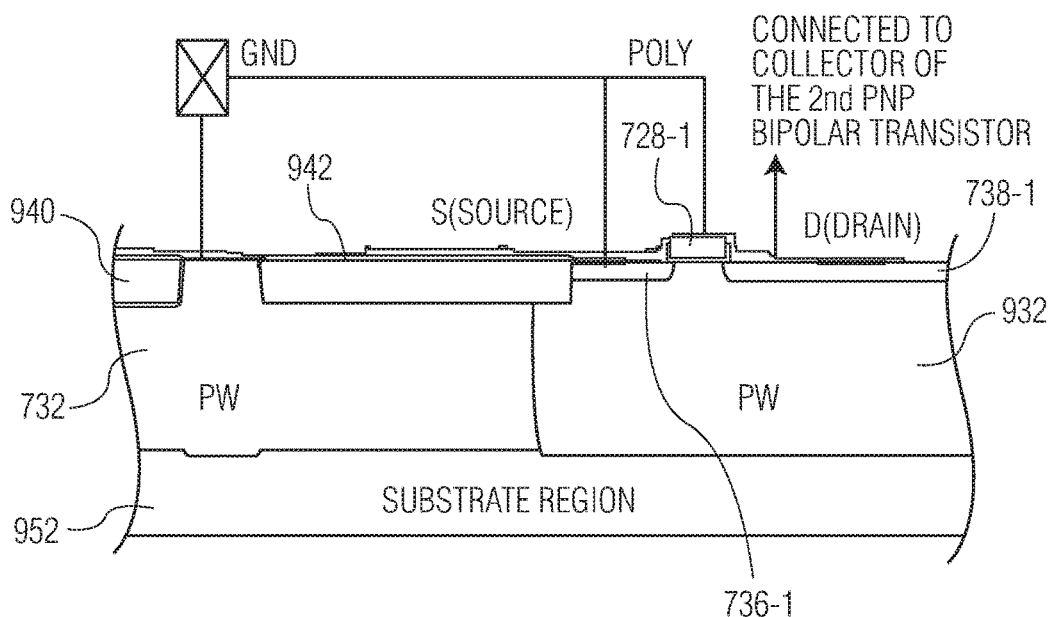
FIG. 9 depicts a cross sectional view of the NMOS transistor depicted in FIG. 7 in accordance with another embodiment of the invention.

FIG. 9 depicts a cross sectional view of the NMOS transistor 712 depicted in FIG. 7 at the location indicated by the line from X to X' in accordance with another embodiment of the invention. In the X-X' cross-sectional view, the NMOS transistor is a grounded-gate NMOS (ggNMOS) transistor whose gate terminal (D) is connected to the ground. As depicted in FIG. 9, the P-well region (PW) 732 and a second P-well region 932 are formed on top of (e.g., in direct contact with) a p-doped substrate region 952, which can be an epitaxial film, an epitaxial layer, or any other suitable substrate structure. The doping concentration of the P-well region 732 may be different from the doping concentration of the second P-well region 932. In some embodiments, the doping concentration of the P-well region 732 is lower than (e.g., one order of magnitude lower than) the doping concentration of the second P-well region 932. For example, the doping concentration of the P-well region 732 is around $1\times10^{17}$ (1E17) atoms/cm$^3$) (e.g., ±5%) while the doping concentration of the second P-well region 932 is around $1\times10^{18}$ (1E18) atoms/cm$^3$) (e.g., ±5%). Compared to the single P-well configuration depicted in FIG. 8, the dual-P-well configuration allows the NMOS transistor to have a lower trigger voltage. The body of the NMOS transistor may be formed within the P-well region 932. The P-well region 732, the source component 736-1 and the gate polysilicon component 728-1 are electrically connected to a ground (GND) pin, which is an embodiment of the second node 120 depicted in FIG. 1. The source component 736-1, the gate polysilicon component 728-1, and the drain component 738-1 of the NMOS transistor are located on top of the P-well region 932. The drain component 738-1 of the NMOS transistor is connected to the collector (C) of the second PNP bipolar transistor 208 depicted in FIG. 2, for example, through conductive material (e.g., one or more metal contacts). A low resistance layer (e.g., a silicided layer) may be formed on the surface of the NMOS transistor for better connection with other circuits (e.g., the second PNP bipolar transistor 208) or one or more terminals (e.g., the GND pin). In the embodiment depicted in FIG. 9, the NMOS transistor does not have a floating base. Consequently, the possibility of potential latch-up problem when the NMOS transistor interacts with adjacent circuits can be reduced. Isolator regions 940 and 942 (e.g., shallow trench isolation regions filled with oxide or other isolation material) are formed on top of the P-well region.

Figure 10:
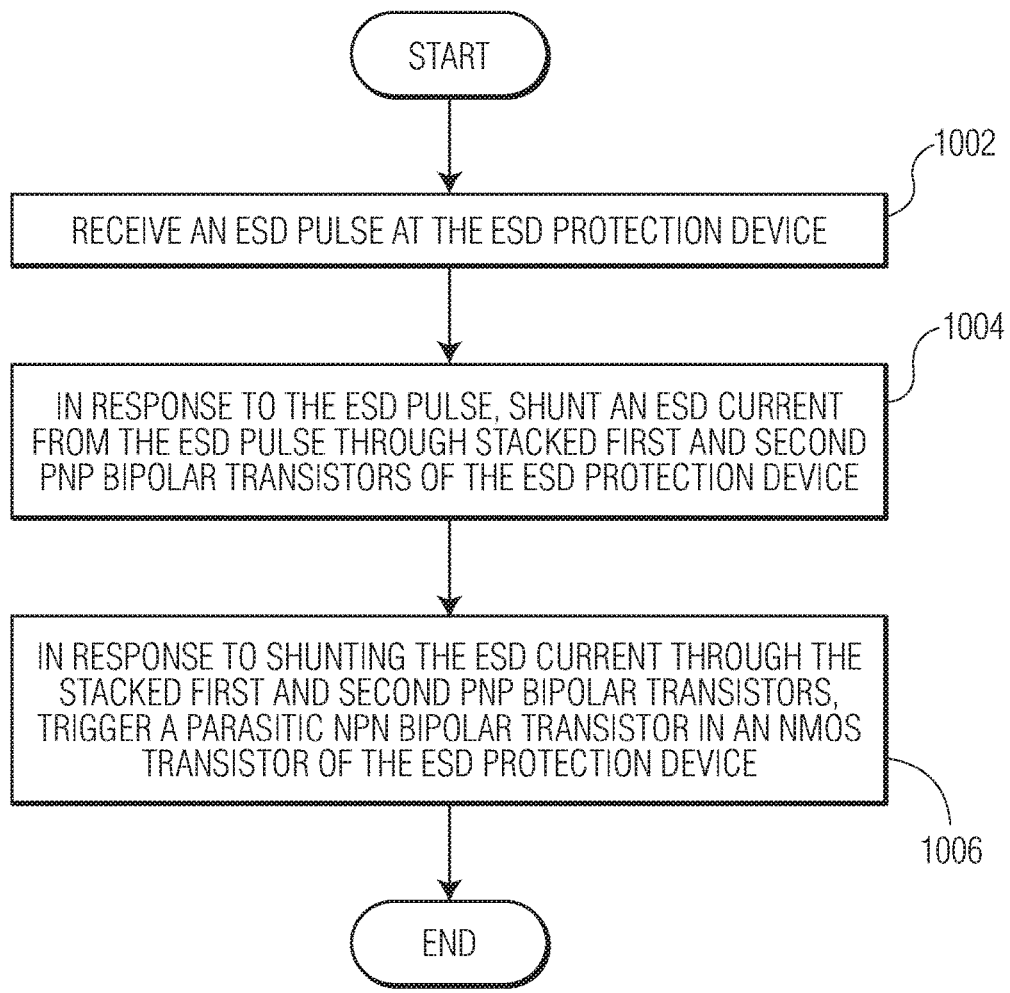
FIG. 10 is a process flow diagram that illustrates a method for operating an ESD protection device in accordance with an embodiment of the invention.

FIG. 10 is a process flow diagram that illustrates a method for operating an ESD protection device in accordance with an embodiment of the invention. At block 1002, an ESD pulse is received at the ESD protection device. At block 1004, in response to the ESD pulse, an ESD current from the ESD pulse is shunted through stacked first and second PNP bipolar transistors of the ESD protection device. At block 1006, in response to shunting the ESD current through the stacked first and second PNP bipolar transistors, a parasitic NPN bipolar transistor in an NMOS transistor of the ESD protection device is triggered. The ESD protection device may be the same as or similar to the ESD protection device 104 depicted in FIG. 1 and/or the ESD protection device 204 depicted in FIG. 2. The first and second PNP bipolar transistors may be the same as or similar to the PNP bipolar transistors 106, 108 depicted in FIG. 1, the PNP bipolar transistors 206, 208 depicted in FIG. 2, the PNP bipolar transistor 306 depicted in FIGS. 3 and 4, and/or the PNP bipolar transistor 508 depicted in FIGS. 5 and 6. The NMOS transistor may be the same as or similar to the NMOS transistor 112 depicted in FIG. 1, the NMOS transistor 212 depicted in FIG. 2, and/or the NMOS transistor 712 depicted in FIGS. 7-9.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising:
    stacked first and second PNP bipolar transistors that are configured to shunt current between a first node and a second node in response to an ESD pulse received between the first and second nodes,
    wherein an emitter and a base of the second PNP bipolar transistor are connected to a collector of the first PNP bipolar transistor; and
    an NMOS transistor connected in series with the stacked first and second PNP bipolar transistors and the second node,
    wherein a gate terminal of the NMOS transistor is connected to a source terminal of the NMOS transistor.

2. The ESD protection device of claim 1,
    wherein an emitter of each PNP bipolar transistor of the stacked first and second PNP bipolar transistors is connected to a base of the PNP bipolar transistor, and wherein the emitter and the base of the first PNP bipolar transistor is connected to the first node.

3. The ESD protection device of claim 2,
    wherein a drain terminal of the NMOS transistor is connected to a collector of the second PNP bipolar transistor.

4. The ESD protection device of claim 3,
    wherein the gate terminal and the source terminal of the NMOS transistor are connected to the second node.

5. The ESD protection device of claim 4,
    wherein a body of the NMOS transistor is connected to the second node.

6. The ESD protection device of claim 5, wherein the second node is connected to ground, and wherein the first node is connected to a positive voltage.

7. The ESD protection device of claim 1, wherein each of the stacked first and second PNP bipolar transistors comprises:
    a plurality of collector components;
    a plurality of emitter components,
    wherein the emitter components are alternately located with respect to the collector components; and
    a base structure that surrounds the collector components and the emitter components.

8. The ESD protection device of claim 7,
    wherein the base structure comprises an N-doped region.

9. The ESD protection device of claim 7,
    wherein the collector components and the emitter components are located on top of an N-well region, and
    wherein the N-well region is located on top of a deep N-well region.

10. The ESD protection device of claim 9,
    wherein each of the stacked first and second PNP bipolar transistors further comprises a P-well region that is separate from the N-well region by a substrate region.

11. The ESD protection device of claim 1,
    wherein the NMOS transistor is formed on top of at least one P-well region, and
    wherein the at least one P-well region is located on top of a substrate region.

12. The ESD protection device of claim 11,
wherein the gate terminal, the source terminal, and a drain terminal of the NMOS transistor are located on top of the at least one P-well region.

13. An electrostatic discharge (ESD) protection device, the ESD protection device comprising:
stacked first and second PNP bipolar transistors that are configured to shunt current between a first node and a second node in response to an ESD pulse received between the first and second nodes,
wherein an emitter and a base of the first PNP bipolar transistor are connected to the first node, and
wherein an emitter and a base of the second PNP bipolar transistor is connected to a collector of the first PNP bipolar transistor; and
a grounded-gate NMOS transistor connected in series with the second PNP bipolar transistor and the second node,
wherein a gate terminal, a source terminal, and a body of the grounded-gate NMOS transistor are connected to the second node, and
wherein the second node is connected to ground.

14. The ESD protection device of claim 13,
wherein a drain terminal of the grounded-gate NMOS transistor is connected to a collector of the second PNP bipolar transistor.

15. The ESD protection device of claim 14, wherein each of the stacked first and second PNP bipolar transistors comprises:
a plurality of collector components;
a plurality of emitter components,
wherein the emitter components are alternately located with respect to the collector components; and
a base structure that surrounds the collector components and the emitter components.

16. The ESD protection device of claim 15,
wherein the base structure comprises an N-doped region,
wherein the collector components and the emitter components are located on top of an N-well region, and
wherein the N-well region is located on top of a deep N-well region.

17. The ESD protection device of claim 16,
wherein each of the stacked first and second PNP bipolar transistors further comprises a P-well region that is separated from the N-well region by a substrate region.

18. The ESD protection device of claim 15,
wherein the grounded-gate NMOS transistor is formed on top of a P-well region,
wherein the P-well region is located on top of a substrate region, and
wherein the gate terminal, the source terminal, and a drain terminal of the grounded-gate NMOS transistor are located on top of the P-well region.

19. The ESD protection device of claim 15,
wherein the grounded-gate NMOS transistor is formed on top of a first P-well region and a second P-well region,
wherein the first and second P-well regions are located on top of a substrate region,
wherein the gate terminal, the source terminal, and a drain terminal of the grounded-gate NMOS transistor are located on top of the second P-well region, and
wherein a doping concentration of the first P-well region is different from a doping concentration of the second P-well region.

20. A method for operating an electrostatic discharge (ESD) protection device, the method comprising:
receiving an ESD pulse at the ESD protection device;
in response to the ESD pulse, shunting an ESD current from the ESD pulse through stacked first and second PNP bipolar transistors of the ESD protection device; and
in response to shunting the ESD current through the stacked first and second PNP bipolar transistors, triggering a parasitic NPN bipolar transistor in an NMOS transistor of the ESD protection device.

* * * * *